United States Patent
Jeong

[19]

[11] Patent Number: 5,834,801
[45] Date of Patent: Nov. 10, 1998

[54] SOLID STATE IMAGE SENSOR HAVING A WIDE LIGHT RECEPTION AREA

[75] Inventor: Jae Hong Jeong, Seoul, Rep. of Korea

[73] Assignee: LG Semicon Co., Ltd., Chungcheongbuk-Do, Rep. of Korea

[21] Appl. No.: 873,727

[22] Filed: Jun. 12, 1997

[30] Foreign Application Priority Data

Jun. 26, 1996 [KR] Rep. of Korea .................. 24095/1996

[51] Int. Cl.[6] .................... H01L 27/148; H01L 29/768
[52] U.S. Cl. .................... 257/232; 257/233; 257/249; 257/250
[58] Field of Search .................... 257/232, 233, 257/245, 249, 250

[56] References Cited

U.S. PATENT DOCUMENTS

| | | | |
|---|---|---|---|
| 5,040,038 | 8/1991 | Yutani et al. | 257/232 |
| 5,399,888 | 3/1995 | Nakashiba | 257/233 |
| 5,661,317 | 8/1997 | Jeong | 257/232 |
| 5,723,884 | 3/1998 | Kim | 257/232 |
| 5,731,601 | 3/1998 | Shioyama et al. | 257/233 |

OTHER PUBLICATIONS

Machio Yamagishi et al., "A 2 Million Pixel FIT–CCD Image Sensor for HDTV Camera Systems", IEEE Transactions on Electron Devices, vol. 38, No. 5, May 1991, pp. 976–980.

Primary Examiner—Ngân V. Ngô
Attorney, Agent, or Firm—Morgan, Lewis & Bockius LLP

[57] ABSTRACT

A solid state image sensor includes a semiconductor substrate and a plurality of transfer lines over the substrate and receiving clock signals, at least one of the plurality of transfer lines having a transparent conductive material. A plurality of transfer electrodes are connected to the transfer lines and a plurality of photoelectric conversion regions under a surface of the substrate generate image signals. A plurality of charge transfer regions under the surface of the substrate transfer the image signals from the photoelectric conversion regions in response to the clock signals from the transfer lines.

15 Claims, 7 Drawing Sheets

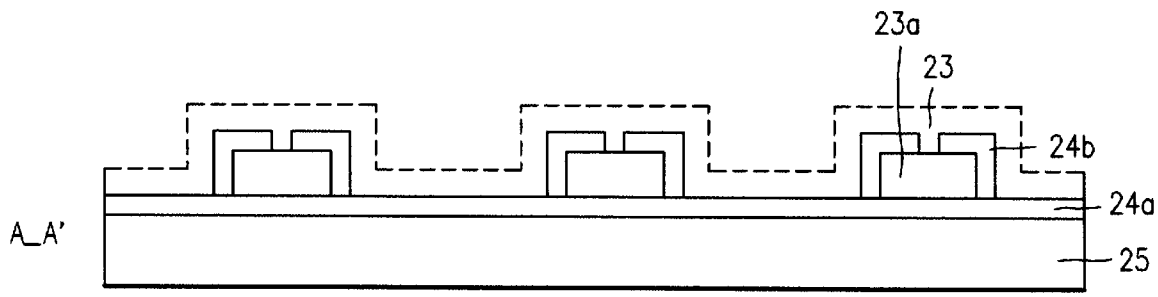
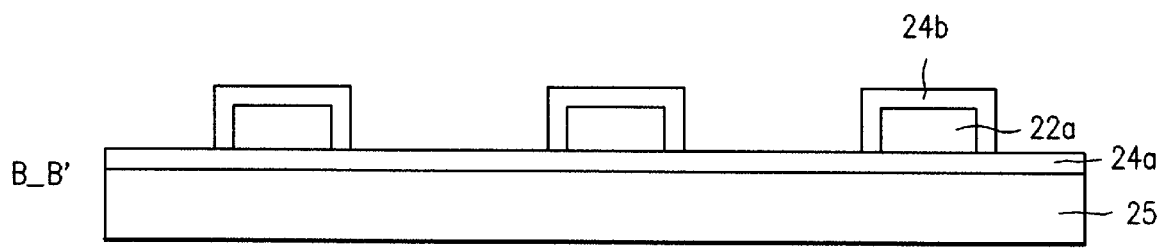
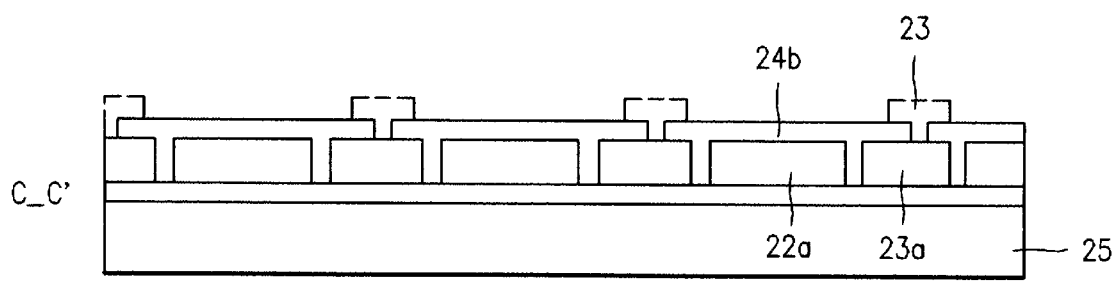
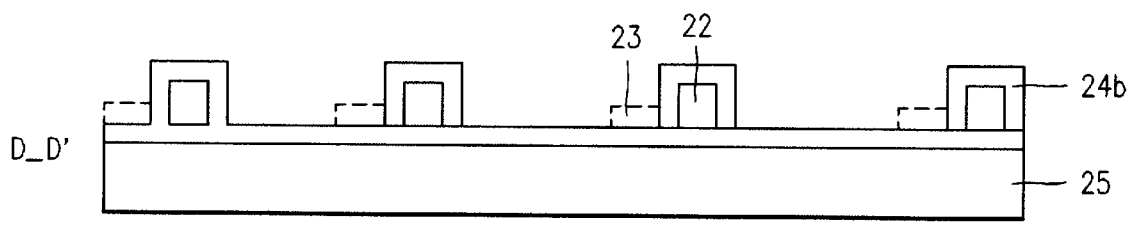

SOLID STATE IMAGE SENSOR HAVING A WIDE LIGHT RECEPTION AREA

BACKGROUND OF THE INVENTION

1. Field of the Invent on

The present invention relates to a solid state image sensor, and more particularly, to a solid state image sensor and a method for fabricating the same having a wide light reception area.

2. Discussion of the Related Art

A conventional solid state image sensor will be explained with reference to FIGS. I and 2A–2E. FIG. 1 illustrates a layout of the conventional solid state image sensor, and FIGS. 2A–2E illustrate relevant sections of the conventional solid state image sensor shown in FIG. 1.

The conventional solid state image sensor has a 4-phase clock applied thereto for transfer of image charges generated in a photoelectric conversion region 1. As means for applying a clock signal, two layers including first and second transfer lines 2 and 3, respectively, are insulated from each other by an insulating film 4, between a plurality of the photoelectric conversion regions 1. The underlying first transfer line 2 is insulated from a semiconductor substrates by another insulating film 6.

Of the 4-phase clock signals applied to the transfer lines 2 and 3, clock signals $\phi 1$ and $\phi 3$ are applied to the first transfer line 2, and clock signals $\phi 2$ and $\phi 4$ are applied to the second transfer line 3.

Each of the first and second transfer lines 2 and 3 includes transfer electrodes formed repeatedly in transfer line regions to correspond to the photoelectric conversion regions 1. Upon repeated application of the $\phi 1$, $\phi 2$, $\phi 3$ and $\phi 4$ clock signals to the first and second transfer lines 2 and 3 having the aforementioned system, respectively, a potential in the underlying transfer line region is changed to transfer the image charges therein toward one direction.

However, in the formation of the first and second transfer lines for applying the 4-phase clock signals in the conventional solid state image sensor, and in view of its process, since the first transfer line should be formed wider than the second transfer line for forming the second transfer line on the previously formed first transfer line, a fill factor (or aperture ratio) is reduced and, consequently, a light sensitivity is decreased. The more the pixel is packed, the more the fill factor is reduced because the number of transfer lines increases as the number of pixels increases.

Therefore, the aforementioned conventional device structure does not allow a highly packed solid state image sensor.

SUMMARY OF THE INVENTION

Accordingly, the present invention is directed to a solid state image sensor and a method for fabricating the same that substantially obviates one or more of the problems due to limitations and disadvantages of the related art.

An object of the present invention is to provide a solid state image sensor and a method for fabricating the same for improving a light sensitivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the solid state image sensor includes a semiconductor substrate, a plurality of photoelectric conversion regions formed under the surface of the substrate for generating image signals, and a plurality of charge transfer regions formed under the surface of the substrate responsive to clock signals applied through transfer lines for transferring the image signals in one direction, including at least one of a plurality of transfer lines formed of a transparent conductive material corresponding to one of the photoelectric conversion regions.

In another aspect, the present invention provides a solid state image sensor including a semiconductor substrate having a surface under which a matrix of photoelectric conversion regions and charge transfer regions are formed, each of the charge transfer regions being formed between adjacent photoelectric conversion regions arranged in a first direction; a first insulating film formed on the surface of the semiconductor substrate; a first transfer line insulated from the semiconductor substrate by the first insulating film, the first transfer line being arranged in a second direction transverse to the first direction between adjacent two photoelectric conversion regions; first transfer electrodes each formed connected to the first transfer line to correspond to one of the photoelectric conversion regions; second transfer electrodes each formed spaced from and opposite to the first transfer electrode on a charge transfer region in which the first transfer electrode is not formed; and, a second transfer line formed on the photoelectric conversion regions, the second transfer line being in contact with the second transfer electrodes formed in the second direction through contact holes in a second insulating film.

In another aspect of the present invention, a solid state image sensor comprises a semiconductor substrate; a plurality of transfer lines over the substrate and receiving clock signals, at least one of the plurality of transfer lines having a transparent conductive material; a plurality of transfer electrodes connected to the transfer lines; a plurality of photoelectric conversion regions under a surface of the substrate and generating image signals; and a plurality of charge transfer regions under the surface of the substrate transferring the image signals from the photoelectric conversion regions in response to the clock signals from the transfer lines.

In another aspect of the present invention, a solid state image sensor comprises a semiconductor substrate having a surface; a matrix of photoelectric conversion regions and charge transfer regions under the surface of the semiconductor substrate, each of the charge transfer regions located between adjacent photoelectric conversion regions arranged in a first direction; a first insulating film on the surface of the semiconductor substrate; a first transfer line insulated from the semiconductor substrate by the first insulating film, the first transfer line being arranged in a second direction transverse to the first direction between adjacent two photoelectric conversion regions; first transfer electrodes each connected to the first transfer line corresponding to one of the photoelectric conversion regions; second transfer electrodes each spaced from and opposite the first transfer electrode on a portion of the charge transfer region; a second insulating film having contact holes on the second transfer electrodes; and a second transfer line on the photoelectric conversion regions, the second transfer line being in contact with the second transfer electrodes in the second direction through the contact holes.

In another aspect of the present invention, a solid state image sensor comprises a semiconductor substrate having a surface; a matrix of photoelectric conversion regions and charge transfer regions under the surface of the semiconductor substrate, each of the charge transfer regions located between adjacent photoelectric conversion regions arranged in a first direction; a first insulating film on the surface of the semiconductor substrate; first and second transfer electrodes spaced from each other and insulated from the semiconductor substrate by the first insulating film, each of the first and second transfer electrodes being arranged in a second direction transverse to the first direction corresponding to the photoelectric conversion regions; a second insulating film on first and second transfer electrodes; and first and second transfer lines at first and second sides on the photoelectric conversion regions in contact with the first and second transfer electrodes, respectively.

In another aspect of the present invention, a method for forming a solid state image sensor including a semiconductor substrate comprises the steps of forming a plurality of transfer lines over the substrate and receiving clock signals, at least one of the plurality of transfer lines being formed with a transparent conductive material; forming a plurality of transfer electrodes connected to the transfer lines; forming a plurality of photoelectric conversion regions under a surface of the substrate and generating image signals; and forming a plurality of charge transfer regions under the surface of the substrate and transferring the image signals from the photoelectric conversion regions in response to the clock signals from the transfer lines.

In another aspect of the present invention, a method for fabricating a solid state sensor having a semiconductor substrate and a plurality of charge transfer regions and photoelectric conversion regions under the substrate comprises the steps of forming a first insulating film on the substrate; depositing a semiconductor layer over a resultant surface of the substrate and patterning the semiconductor layer to form first and second transfer electrodes; forming a second insulating film over a resultant surface of the substrate and selectively removing portions of the second insulating film to form contact holes; and depositing a transparent conducive material on a resultant surface of the substrate and patterning the transparent conductive material to form transfer lines, the transfer lines contacting the first transfer electrodes through the contact holes at one side of the photoelectric conversion regions.

In a further aspect, the present invention provides the method for fabricating a solid state image sensor including the steps of providing a semiconductor substrate having a surface under which a plurality of charge transfer regions and photoelectric conversion regions are formed; forming a first insulating film on the substrate; depositing polysilicon on an entire resultant surface having the first insulating film formed thereon and patterning the polysilicon to leave the polysilicon only on predetermined parts, thereby to form first and second transfer electrodes; forming a second insulating film on an entire surface and selectively removing portions of the second insulating film to form contact holes; and, depositing a transparent conductive material on an entire resultant surface having the contact holes formed therein and patterning the transparent conductive material to leave the transparent conductive material in contact with each of the second transfer electrodes in one side of each of the photoelectric conversion regions, thereby forming second transfer lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIGS. 4A–4D illustrates relevant sections of the solid state image sensor shown in FIG. 3;

DETAILED DESCRIPTION OF THE PREFERRED EMBODIMENT

Reference will now be made in detail to the preferred embodiments of the present invention, examples of which are illustrated in the accompanying drawings.

Figure 1:
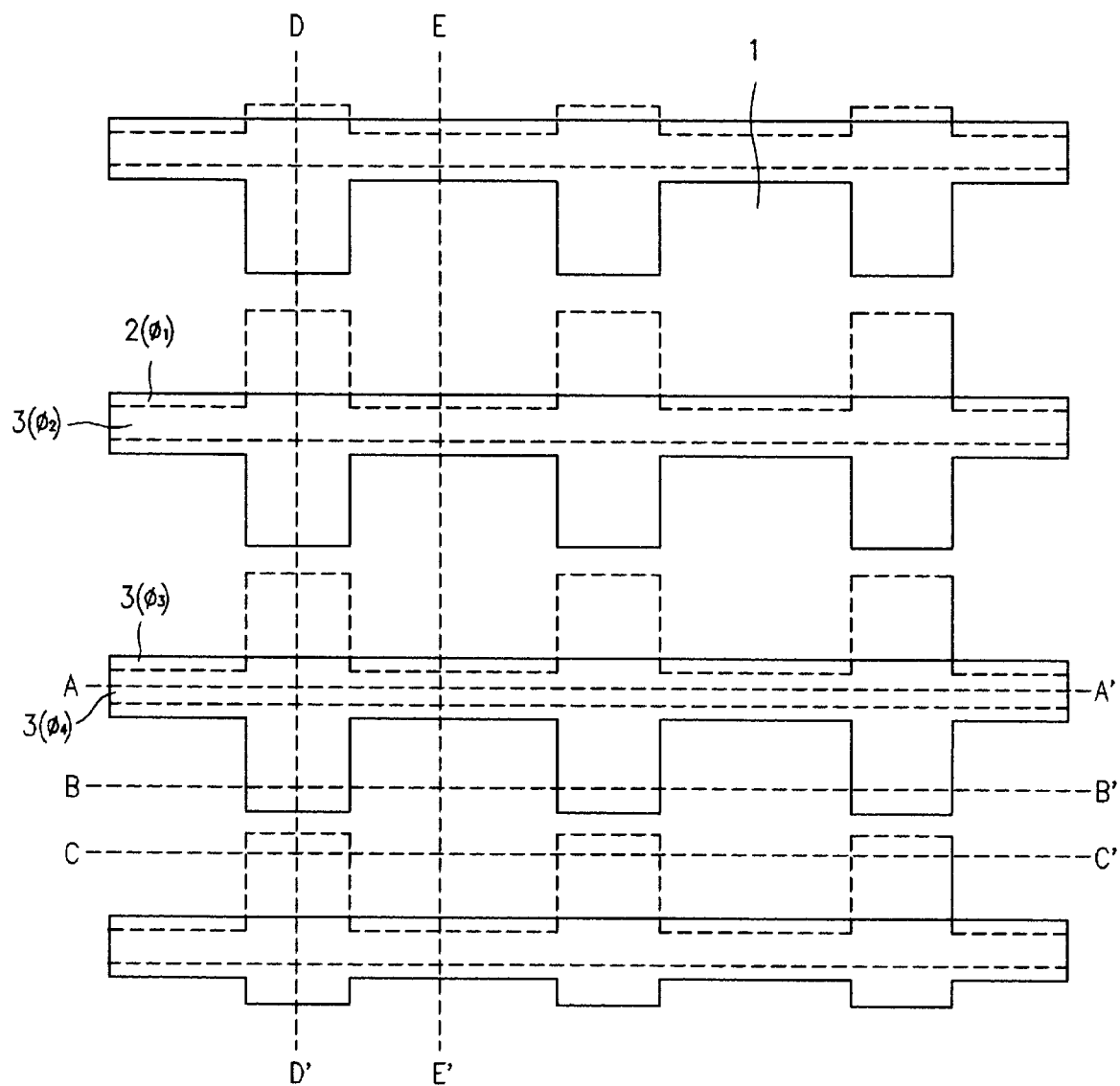
FIG. 1 illustrates a layout of a conventional solid state image sensor.
Figure 2A:
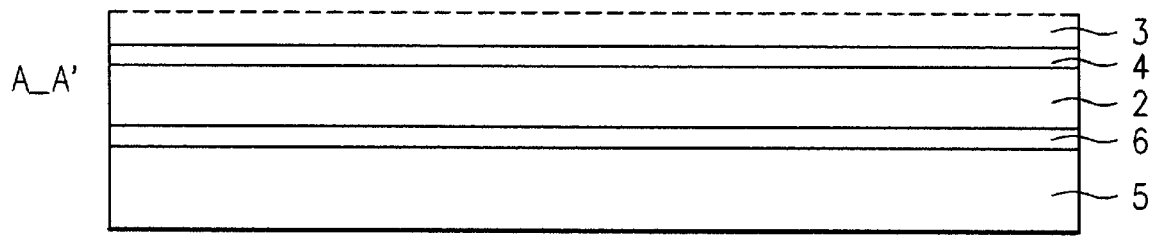
FIGS. 2A–2E illustrate relevant sections of the conventional solid state image sensor shown in FIG. 1.
Figure 2B:
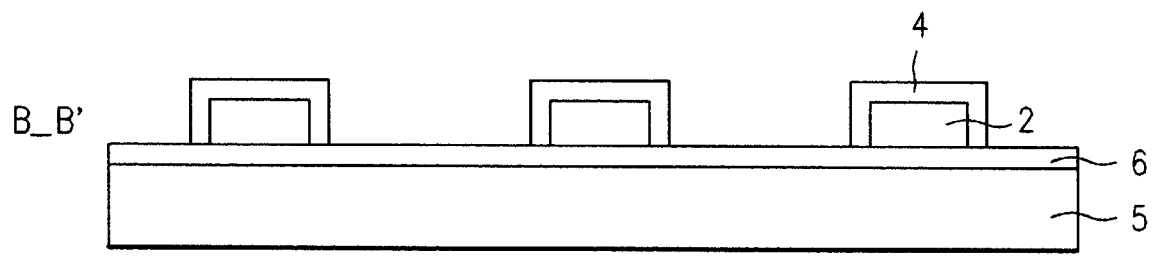
Figure 2C:
Figure 2D:
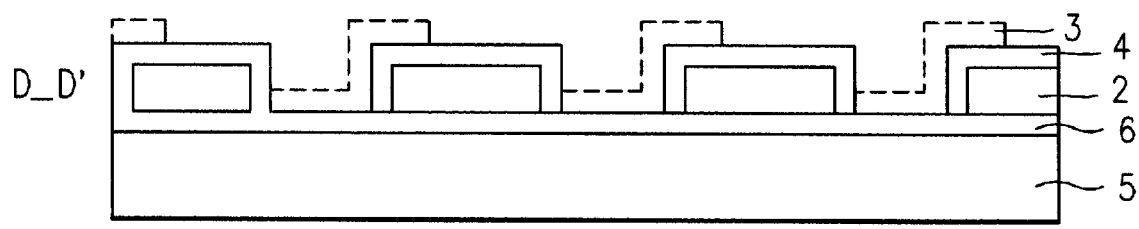
Figure 2E:
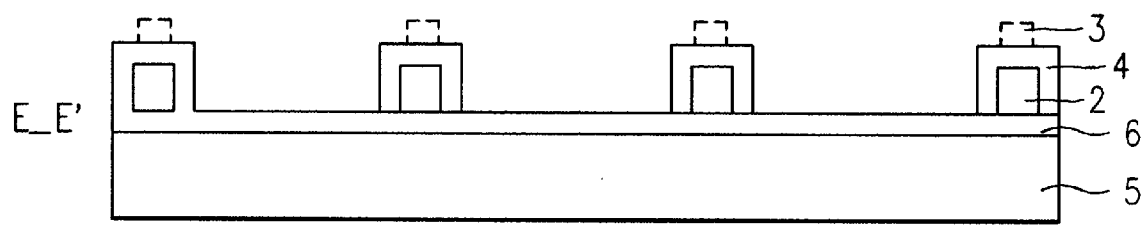
Figure 3:
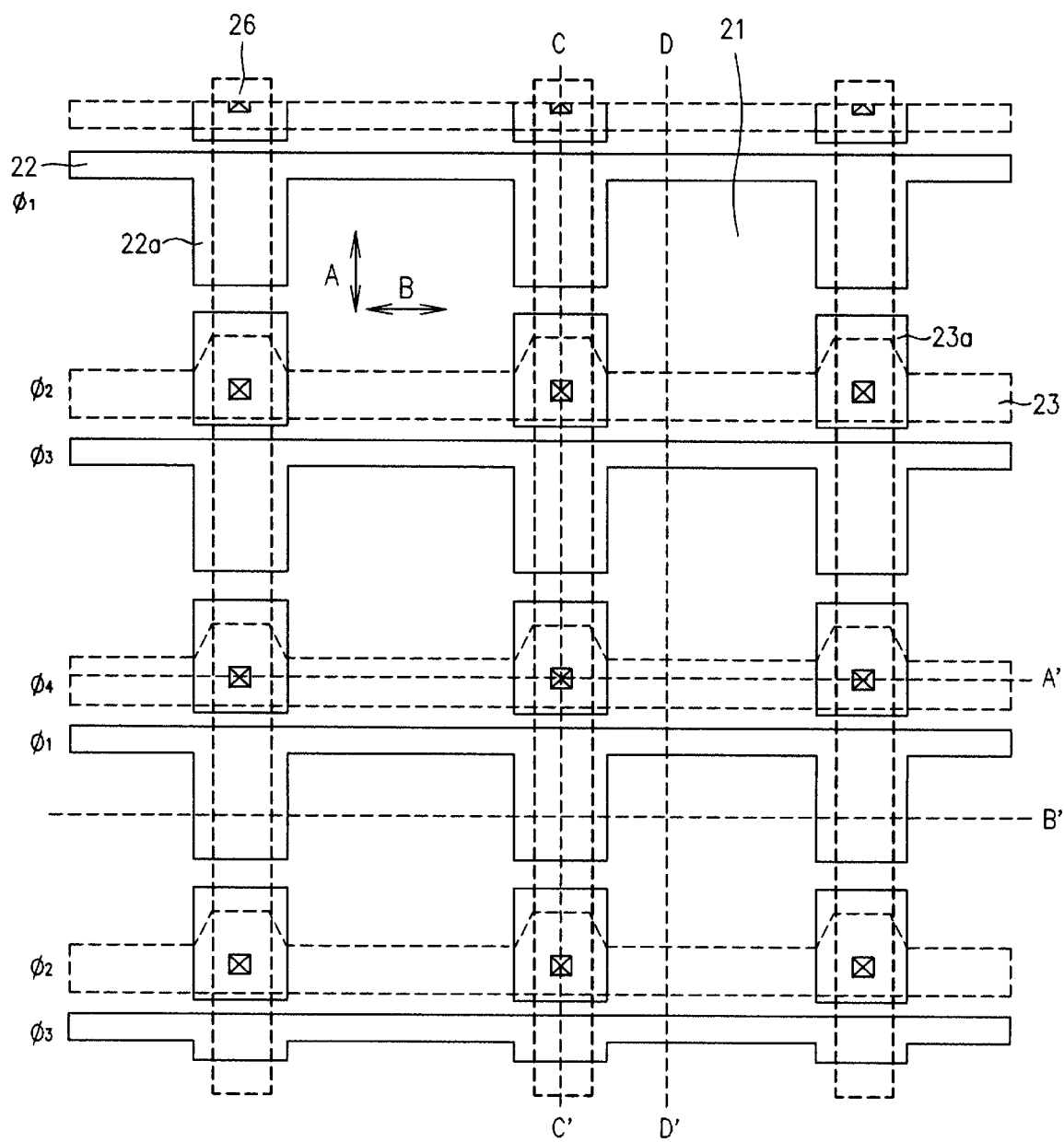
FIG. 3 illustrates a layout of a solid state image sensor in accordance with a first embodiment of the present invention.

FIG. 3 illustrates a layout of a solid state image sensor in accordance with a first embodiment of the present invention, and FIGS. 4A–4D illustrate sections of the solid state image sensor shown in FIG. 3.

Referring to FIG. 3, the solid state image sensor in accordance with the present invention includes a first transfer line 22 formed between adjacent photoelectric conversion regions 21 in a direction right angle to the direction of charge transfer, and a second transfer line 23 formed of a material which has a low resistance and is transparent to visible light on photoelectric conversion regions 21 parallel to the first transfer line 22.

Referring to FIGS. 4A–4D, the solid state image sensor in accordance with a first embodiment of the present invention includes a first insulating film 24a formed on an entire surface of a semiconductor substrate 25 having a matrix of photoelectric conversion regions 21 and charge transfer regions 26 each formed between adjacent photoelectric conversion regions 21 in a first direction "A", A first transfer line 22 is insulated from the semiconductor substrate 25 by the first insulating film 24a formed in a second direction "B" transverse to the first direction "A" for applying $\phi 1$ and $\phi 3$ clock signals to a region between two photoelectric conversion regions 21. First transfer electrodes 22a are each formed connected to the first transfer line 22 corresponding to one of the photoelectric conversion regions 21. Second transfer electrodes 23a are each formed opposite to the first transfer electrode 22a on a charge transfer region 26 where the first transfer electrode 22a is not formed. A second insulating film 24b is formed on an entire surface including the first transfer line 22, the first transfer electrode 22a, and the second transfer electrode 23a. A second transfer line 23 is formed on the photoelectric conversion regions 21 in contact with the second transfer electrodes 23a formed in the second direction for applying $\phi 2$ and $\phi 4$ clock signals thereto.

The steps for fabricating the solid state image sensor in accordance with the first embodiment of the present invention will be explained.

A first insulating film 24a is formed on a semiconductor substrate 25 having a matrix of photoelectric conversion regions 21 and charge transfer regions 26 each formed in a first direction between adjacent photoelectric conversion regions 21 for use as transfer channels in transferring image charges generated in the photoelectric conversion regions 21 toward the first direction "A". On an entire surface of the substrate having the first insulating film 24a formed thereon, polysilicon is deposited and patterned to leave portions of the polysilicon on predetermined parts. The patterned polysilicon forms the first transfer lines 22 in a second direction "B" transverse to the first direction "A" between adjacent photoelectric conversion regions 21, first transfer electrodes 22a each on one of the charge transfer regions 26 connected to one of the first transfer lines 22 corresponding to one of the photoelectric conversion regions 21, and second transfer electrodes 23a each opposite to corresponding one of the first transfer electrodes 22a. The first transfer electrodes 22a, and second transfer electrodes 23a are preferably formed simultaneously by patterning the polysilicon.

Then, a second insulating film 24b is formed on an entire surface having the first transfer lines 22 and the second transfer electrodes 23a including the first transfer electrodes 22a. Portions of the second insulating film on the second transfer electrodes 23a are removed selectively to form contact holes.

On an entire resultant surface where the contact holes have been formed, a material having a low resistance and transparent to visible light, such as indium tin oxide (ITO) is deposited and patterned to leave a portion of the material in contact with each of the second transfer electrodes 23a at one side of each of the photoelectric conversion regions 21, thereby forming second transfer lines 23.

Figure 5:
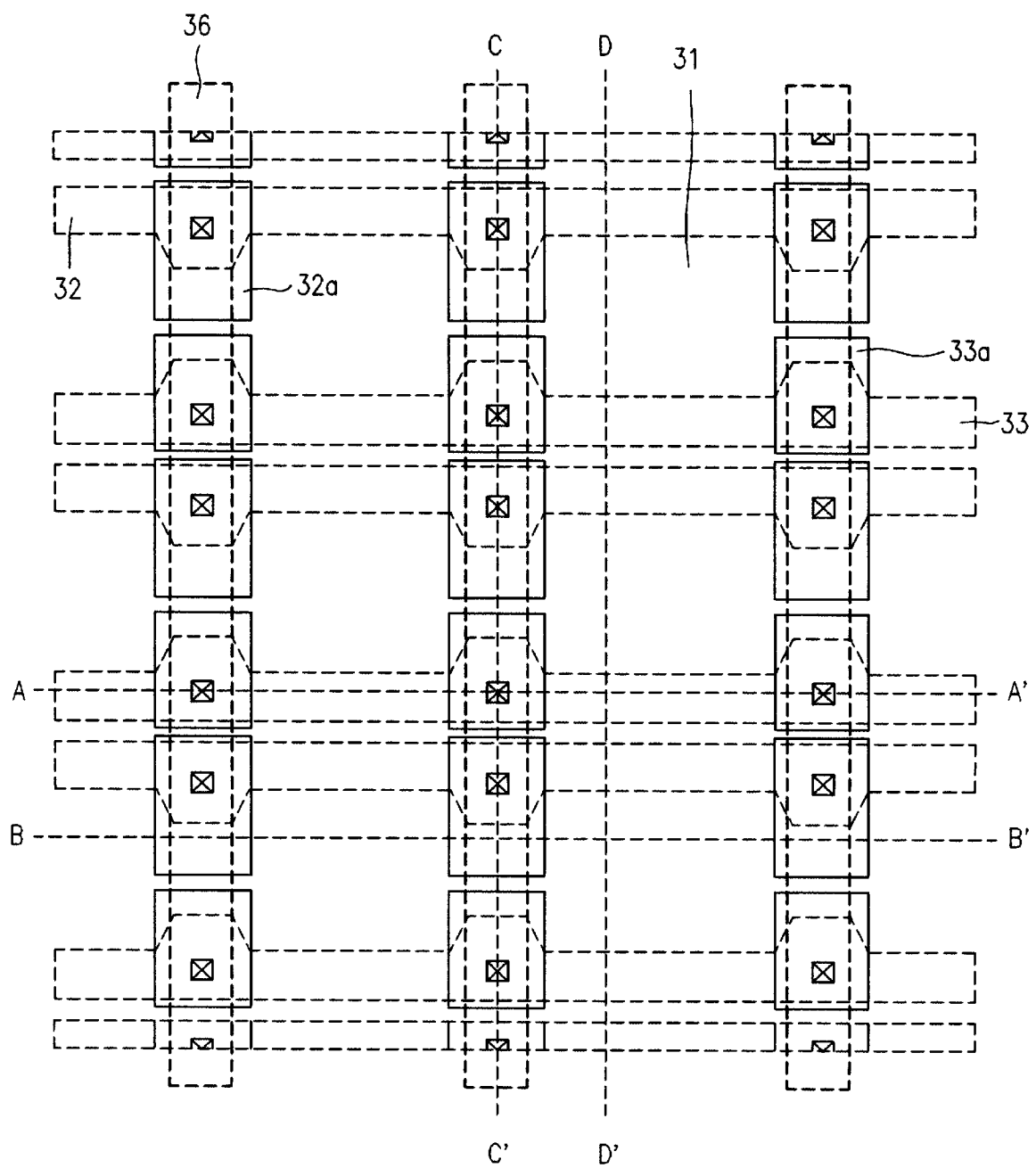
FIG. 5 illustrates a layout of a solid state image sensor in accordance with a second embodiment of the present invention.
Figure 6A:
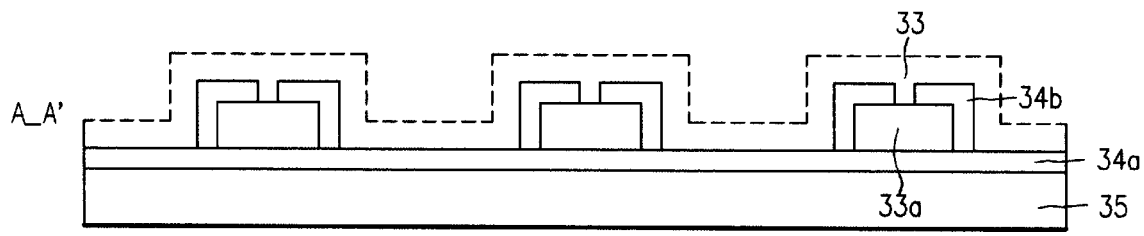
FIG. 6A–6D illustrate relevant sections of the solid state image sensor shown in FIG. 5.
Figure 6B:
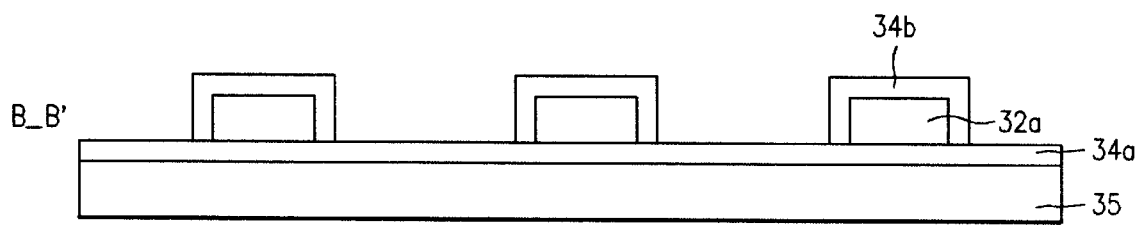
Figure 6C:
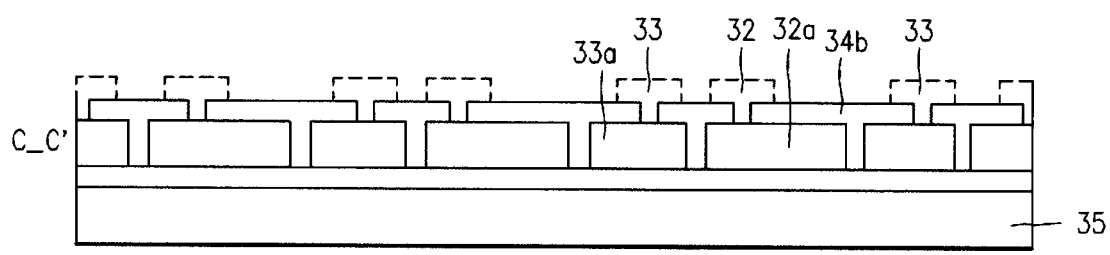
Figure 6D:
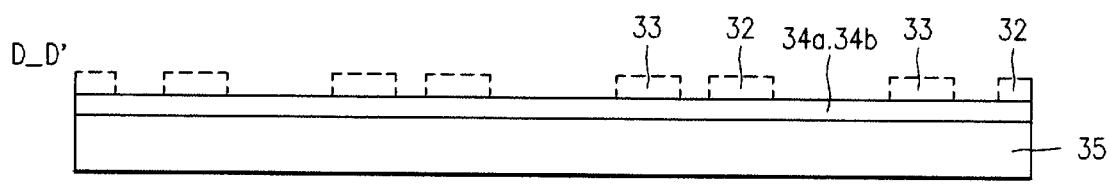

FIG. 5 illustrates a layout of a solid state image sensor in accordance with a second embodiment of the present invention, and FIGS. 6A–6D illustrate sections of the conventional solid state image sensor shown in FIG. 5.

Referring to FIGS. 5 and 6A–6D, a solid state image sensor in accordance with the second embodiment of the present invention includes first and second transfer electrodes 32a and 33a formed of a semicondutor material, such as polysilicon and amorphous silicon, spaced apart from one another. First and second transfer lines 32 and 33 are formed of a transparent conductive material, such as ITO, for applying clock signals to the first and second transfer electrodes 32a and 33a, respectively.

The solid state image sensor in accordance with the second embodiment includes a first insulating film 34a formed on an entire surface of a semiconductor substrate 35 having a matrix of photoelectric conversion regions 31 and charge transfer regions 36, each formed between adjacent photoelectric conversion regions 31 in a first direction. First transfer electrodes 32a insulated from the semiconductor substrate 35 by the first insulating film 34a are each formed corresponding to a respective one of the photoelectric conversion regions 31. Second transfer electrodes 33a are each formed opposite to and spaced from a respective one of the first transfer electrodes 32a on a charge transfer region 36 where the first transfer electrode 32a is not formed. A second insulating film 34b is formed on a resultant entire surface including the first and second transfer electrodes 32a and 33a. First and second transfer lines 32 and 33 are formed on the photoelectric conversion regions 31 at first and second sides thereof, respectively, in contact with the first and second transfer electrodes 32a and 33a, respectively, in a second direction right angle to the first direction. Clock signals φ1 and φ3, and φ2 and φ4 are applied to the first and second transfer lines 32 and 33, respectively. The first and second transfer lines 32 and 33 are formed of a transparent conductive material, such as ITO, and the first and second transfer electrodes 32a and 33a are formed of a semiconductor material such as polysilicon or amorphous silicon.

The steps of a method for fabricating the solid state image sensor in accordance with the second embodiment of the present invention will be explained.

A first insulating film 34a is formed on an entire surface of a semiconductor substrate 35 having a matrix of photoelectric conversion regions 31 and charge transfer regions 36 for use as transfer channels in transferring image charges generated in the photoelectric conversion regions 31. On an entire resultant surface of the substrate having the first insulating film 34a formed thereon, polysilicon is deposited and patterned to leave the polysilicon only on predetermined parts. The patterned polysilicon forms the first transfer electrodes 32a on the charge transfer regions 36 corresponding to the photoelectric conversion regions 31 and the second transfer electrodes 33a spaced apart from the first transfer electrodes 32a. The first and second transfer electrodes 32a and 33a are preferably formed simultaneously by patterning the polysilicon.

Then, on an entire resultant surface having the first transfer electrodes 32a and the second transfer electrodes 33a formed thereon, a second insulating film 34b is formed. Portions of the insulating film 34b are selectively removed to form contact holes. On an entire resultant surface having the contact holes, a material having a low resistance and transparent to visible light, such as ITO, is deposited and patterned to leave the material at first and second sides of each of the photoelectric conversion regions 31 and in contact with the first and second transfer electrodes 32a and 33a, respectively, thereby forming the first and second transfer lines 32 and 33, respectively.

The single layer formation of the first and second transfer lines of transparent conductive material of the present invention permits a reduction in the width of each of the transfer lines to provide a maximum fill factor. Thus, the solid state image sensor of the present invention allows fabrication of highly packed solid state image sensors, and has an advantage of improving light sensitivity due to the increase in the fill factor.

It will be apparent to those skilled in the art that various modifications and variations can be made in the solid state image sensor and method for fabricating the same of the present invention without departing from the spirit or scope of the invention. Thus, it is intended that the present invention cover the modifications and variations of this invention provided they come within the scope of the appended claims and their equivalents.

What is claimed is:

1. A solid state image sensor comprising:

a semiconductor substrate;

a plurality of transfer lines over the substrate and receiving clock signals, at least one of the plurality of transfer lines having a transparent conductive material;

a plurality of transfer electrodes connected to the transfer lines;

a plurality of photoelectric conversion regions under a surface of the substrate and generating image signals; and a plurality of charge transfer regions under the surface of the substrate transferring the image signals from the photoelectric conversion regions in response to the clock signals from the transfer lines.

2. The solid state image sensor according to claim 1, wherein the plurality of transfer lines include first transfer lines at a first side of the photoconversion regions and second transfer lines at a second side of the photoconversion regions, the first transfer lines including the at least one transfer line having the transparent conductive material.

3. The solid state image sensor according to claim 1, wherein the transfer lines include first transfer lines having non-transparent conductive material at a first side of the photoelectric conversion regions and second transfer lines having transparent conductive material at a second side of the photoelectric conversion regions.

4. The solid state image sensor according to claim 1, wherein the transparent conductive material includes indium tin oxide (ITO).

5. The solid state image sensor according to claim 1, wherein the at least one transfer line of the transparent conductive material is on one of the photoelectric conversion regions.

6. The solid state image sensor according to claim 1, wherein the transfer electrodes extending from the plurality of transfer lines are spaced apart from one another corresponding to the photoelectric conversion regions.

7. The solid state image sensor according to claim 1, further comprising an insulating film insulating the transfer lines and the transfer electrodes from the semiconductor substrate.

8. The solid state image sensor according to claim 7, wherein the insulating film includes a contact hole, and the transfer lines are connected to the transfer electrodes through the contact hole.

9. The solid state image sensor according to claim 1, wherein the transfer electrode includes polysilicon.

10. A solid state image sensor comprising:
a semiconductor substrate having a surface;
a matrix of photoelectric conversion regions and charge transfer regions under the surface of the semiconductor substrate, each of the charge transfer regions located between adjacent photoelectric conversion regions arranged in a first direction;
a first insulating film on the surface of the semiconductor substrate;
a first transfer line insulated from the semiconductor substrate by the first insulating film, the first transfer line being arranged in a second direction transverse to the first direction between adjacent two photoelectric conversion regions;
first transfer electrodes each connected to the first transfer line corresponding to one of the photoelectric conversion regions;
second transfer electrodes each spaced from and opposite the first transfer electrode on a portion of the charge transfer region;
a second insulating film having contact holes on the second transfer electrodes; and
a second transfer line on the photoelectric conversion regions, the second transfer line being in contact with the second transfer electrodes in the second direction through the contact holes,
wherein the second transfer line includes a transparent conductive material.

11. The solid state image sensor according to claim 10, wherein the first transfer line and the first and second transfer electrodes include polysilicon.

12. The solid state image sensor according to claim 10, wherein the transparent conductive material includes indium tin oxide.

13. A solid state image sensor comprising:
a semiconductor substrate having a surface;
a matrix of photoelectric conversion regions and charge transfer regions under the surface of the semiconductor substrate, each of the charge transfer regions located between adjacent photoelectric conversion regions arranged in a first direction;
a first insulating film on the surface of the semiconductor substrate;
first and second transfer electrodes spaced from each other and insulated from the semiconductor substrate by the first insulating film, each of the first and second transfer electrodes being arranged in a second direction transverse to the first direction corresponding to the photoelectric conversion regions;
a second insulating film on first and second transfer electrodes; and
first and second transfer lines at first and second sides on the photoelectric conversion regions in contact with the first and second transfer electrodes, respectively,
wherein at least one of the first and second transfer lines includes a transparent conductive material.

14. The solid state image signal according to claim 13, wherein first and third clock signals of four phase clock signals are coupled to the first transfer lines, and the second and fourth clock signals are coupled to the second transfer lines.

15. The solid state image signal according to claim 13, wherein the transparent conductive material includes indium tin oxide.

* * * * *